United States Patent
Spitz

(10) Patent No.: US 7,701,774 B2
(45) Date of Patent: Apr. 20, 2010

(54) VOLTAGE REGULATOR FOR A BIT LINE OF A SEMICONDUCTOR MEMORY CELL

(75) Inventor: Markus Spitz, Duesseldorf (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 11/554,868

(22) Filed: Oct. 31, 2006

(65) Prior Publication Data

US 2007/0097754 A1    May 3, 2007

(30) Foreign Application Priority Data

Oct. 31, 2005    (DE) .................. 10 2005 052 058

(51) Int. Cl.
*G11C 16/06* (2006.01)
(52) U.S. Cl. .................. 365/185.21; 365/185.2
(58) Field of Classification Search .......... 365/185.2, 365/185.21
See application file for complete search history.

(56) References Cited

U.S. PATENT DOCUMENTS

| | | | |
|---|---|---|---|
| 5,946,238 A * | 8/1999 | Campardo et al. ...... 365/185.2 |
| 6,101,118 A | 8/2000 | Mulatti et al. | |
| 6,449,191 B1 * | 9/2002 | Lin et al. ............... 365/185.21 |
| 6,490,199 B2 * | 12/2002 | Lee et al. .............. 365/185.21 |
| 6,707,717 B2 * | 3/2004 | Jun-Lin ................. 365/185.21 |
| 7,167,394 B2 * | 1/2007 | La Placa et al. ......... 365/185.2 |
| 7,184,348 B2 * | 2/2007 | Crippa et al. ............. 365/207 |
| 2002/0118576 A1 * | 8/2002 | Ohba et al. ............ 365/189.07 |

FOREIGN PATENT DOCUMENTS

DE    101 02 180 A1    5/2002
EP    0 936 620 A1    8/1999

* cited by examiner

*Primary Examiner*—Hoai V Ho
(74) *Attorney, Agent, or Firm*—Dicke, Billig & Czaja, PLLC

(57) ABSTRACT

A voltage regulator for a bit line of a semiconductor memory cell is disclosed. In one embodiment, the voltage regulator includes an inverter, a feedback transistor, and a band gap reference voltage source. The inverter includes an inverter input connected to the bit line, and an inverter output. The feedback transistor includes a feedback source connected to the inverter input, and a feedback gate connected to the inverter output. The band gap reference voltage source predetermines the voltage to which the inverter input is regulated.

16 Claims, 4 Drawing Sheets

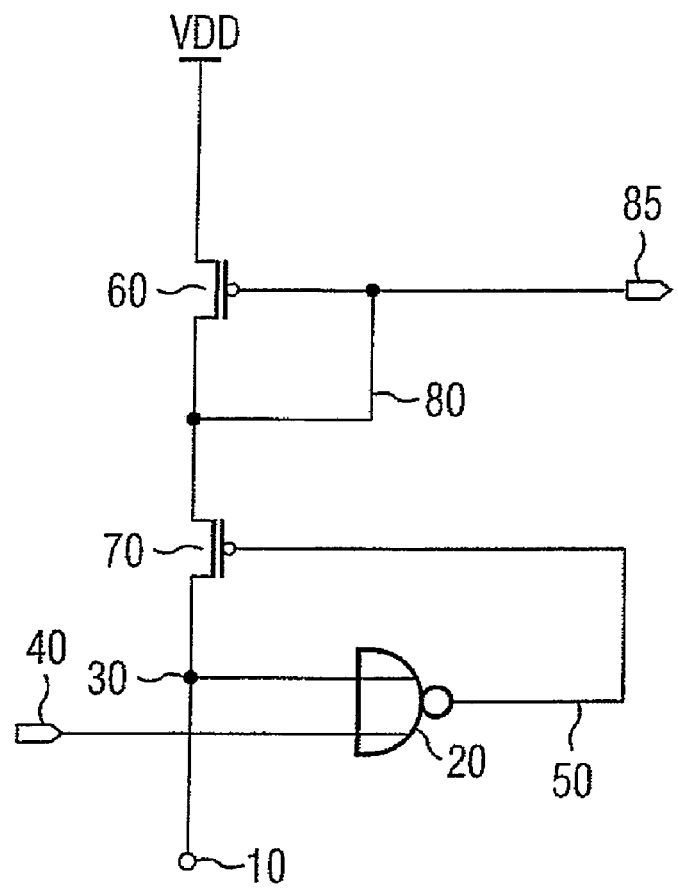

US 7,701,774 B2

VOLTAGE REGULATOR FOR A BIT LINE OF A SEMICONDUCTOR MEMORY CELL

CROSS-REFERENCE TO RELATED APPLICATIONS

This Utility Patent Application claims priority to German Patent Application No. DE 10 2005 052 058.8 filed on Oct. 31, 2005, which is incorporated herein by reference.

BACKGROUND

The present invention relates to semiconductor memories and a voltage regulator for a bit line of a semiconductor memory cell.

Semiconductor memories usually consist of a matrix of semiconductor memory cells. Each cell is adapted to be controlled separately via a word line and a bit line.

As memory cells, flash memory cells or EEPROM memory cells could be employed in particular. The term EEPROM is an English abbreviation of "Electrically Erasable Programmable Read-Only Memory". It is a non-volatile memory, i.e. the memory information is maintained even if the memory is not supplied with energy. The memory content can be programmed by electric pulses.

The memory cell of an EEPROM consists of a field effect transistor having a floating gate. The floating gate is a conductor piece above the source drain channel of the EEPROM. The floating gate is electrically isolated from its surrounding, so that charges available on the floating gate cannot flow off readily. The programming of the memory cell is performed in that charges are applied on the floating gate or removed from the floating gate.

The charge available on the floating gate generates a threshold voltage shift of the memory transistor, i.e. the conductivity between the source and the drain is influenced by the floating gate. For reading out the memory information, the current flowing through the memory transistor is ultimately measured. To this end, a constant voltage is applied to the bit line of the memory cell which is connected with the drain. The source of the EEPROM is grounded. Subsequently, the current flowing from the drain to the source is measured. The current intensity measured is a measurement of the charge state of the memory cell.

Voltage regulators are used to charge, during the reading out of the EEPROM, the voltage on the bit line to a set point, and to keep the charge on the set point. FIG. 1 illustrates a conventional voltage regulator used for the reading out of semiconductor memory cells. First of all, the memory cell to be read out is chosen from the memory matrix and connected through to an input 10 of the voltage regulator. The circuit diagram of FIG. 1 illustrates a NOR gate 20. The NOR gate includes two inputs 30 and 40. The first input 30 of the NOR gate 20 is connected to the input of the voltage regulator. The bit line of the memory cell and the input 30 are connected with each other. The voltage regulator of FIG. 1 thus is to provide a predetermined potential on the line 10.

The second input 40 merely serves to switch the voltage regulator on or off. In the on-state, the input is on a low voltage level, so that the NOR gate 30 operates as an inverter with respect to the input 30 and the output 50. An inverter or not-gate is a gate with an input and an output, which fulfills the logic function "not" or "negation", respectively. A logic "One" at the input becomes a logic "Zero" at the output of the inverter, and vice versa. Two voltage levels correspond to the logic "One" and "Zero". The inverter supplies an increased output voltage (high level) if no voltage is present at the input. Vice versa, in the case of an increased voltage at the input 30, a low output voltage (low level) is provided by the inverter 20. The characteristic curve of the inverter thus corresponds to a process.

The output 50 of the NOR gate 20 is fed back to the input 30 via a feedback transistor 70. The transistor 70 includes a gate G that is connected with the output 50. The source S of the transistor 70 is connected with the input 30 of the NOR gate 20. The feedback finally provides for the voltage at the NOR gate 30 to be regulated to a particular value.

The NOR gate is connected through by means of the input 40, so that the input 30 and the output 50 act as inverters. FIG. 2a illustrates the section of FIG. 1 that will be discussed in the following. Instead of the NOR gate 20, an inverter 90 is illustrated. Otherwise, the circuit illustrated in FIG. 2a is equal to that of FIG. 1. FIG. 2b illustrates a coordinate system in which the input voltage $U_e$ at the input 30 of the inverter 90 is plotted against the output voltage $U_a$ at the output 50 of the inverter. The characteristic curve 100 of the inverter 90 has a cascaded progression. In the case of a low input voltage $U_e$, a high output voltage $U_a$ is output. Vice versa, the output voltage $U_a$ is low if the input voltage is high.

If the output 50 of the inverter 90 were directly connected with the input, the inverter 90 would have to exhibit at the operating point the same voltage at the input 30 and at the output 50.

FIG. 2b illustrates the bisecting line 110 of the ordinate and the abscissa of the coordinate system. Each point on the bisecting line 110 therefore has the same voltage $U_a$ and $U_e$. The intersection of the bisecting line 110 with the characteristic curve 100 indicates the switch point 120 that materializes in the case of a direct feedback. At the input and at the output of the inverter the voltage $U_s$ would be present.

The fed-back inverter adjusts itself to its switching threshold. The progression of the characteristic curve in the region of the switch point 120 is substantially linear. As soon as the input voltage $U_e$ is larger than the switch point $U_s$, a voltage that is smaller than $U_s$ is generated at the output 50, and vice versa. Due to the negative feedback, the input 30 is thus again shifted in the direction of $U_s$.

The transistor 70 illustrated in FIGS. 1 and 2a effects in balance a voltage difference between the output voltage $U_a$ and the input voltage $U_e$. The operating point of the fed-back inverter circuit is thus shifted by the gate-source-voltage in the direction along the ordinate. Reference sign 115 illustrates a parallel line to the bisecting line which has been shifted along the ordinate by the voltage difference. Thus, there results the corresponding operating point 125 in FIG. 2b. The output voltage at the operating is $U_e+U_{th}+\Delta U$. $U_{th}$ is the threshold voltage of the transistor 70; $\Delta U$ is the overdrive voltage of the transistor 70. The overdrive voltage+$\Delta U$ is very small vis-à-vis the threshold voltage $U_{th}$, so that there applies approximately $U_{th} \approx U_{th}+\Delta U$. The gate current of the transistor 70 is negligible. The transistor 70 thus prevents current to be fed into the line 30 through the output 50 of the inverter. The current intensity on line 30 is to remain unaltered since it carries the bit line current that is ultimately to be measured. The feedback transistor has a voltage-stabilizing effect. If the voltage at the input 30 of the inverter 90 decreases, the voltage at the output 50 of the inverter increases. Thus, the gate-source-voltage at the transistor 70 increases, so that the source current is increased. Charge carriers are increasingly added to the input 30, so that the potential thereof increases. In the case of a voltage increase at the input 30, the voltage at the output 50 of the inverter decreases. Thus, the gate-source-voltage at the transistor 70 decreases, so that the source current is reduced. If the gate-source-voltage at the transistor 70 underruns the threshold voltage, no more current is supplied to the bit line.

The bit line is thus regulated by the feedback transistor 70 as a source follower to a voltage level that depends on the characteristic curve of the NOR gate 20 or of the corresponding inverter 90, respectively. The signal on line 85 is then further processed for evaluation of the current through the bit line. The evaluation of the memory state is performed by a voltage or current comparison.

The disadvantage of the prior art voltage regulator described is the strong dependency of the bit line voltage on the transistor dimensions in the NOR gate. It is in particular fluctuating process parameters that influence the characteristic curve progression of the NOR gate, so that the operating point is shifted. Furthermore, the bit line voltage depends on the operating voltage $V_{DD}$ since the switch point 120 of the NOR gate in FIG. 1 is also shifted. The higher the operating voltage $V_{DD}$, the higher becomes the bit line voltage. Last but not least, temperature fluctuations have a strong influence on the input voltage at the input 30 of the NOR gate 20 or of the inverter 90, respectively.

For these and other reasons, there is a need for the present invention.

SUMMARY

One embodiment provides a voltage regulator for a bit line of a semiconductor memory cell. In one embodiment, the voltage regulator includes an inverter, a feedback transistor, and a band gap reference voltage source. The inverter includes an inverter input connected to the bit line, and an inverter output. The feedback transistor includes a feedback source connected to the inverter input, and a feedback gate connected to the inverter output. The band gap reference voltage source predetermines the voltage to which the inverter input is regulated.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 1 illustrates a bit line regulator according to prior art.

FIG. 2b illustrates a characteristic curve of the inverter of FIG. 2a.

DETAILED DESCRIPTION

Figure 2A:
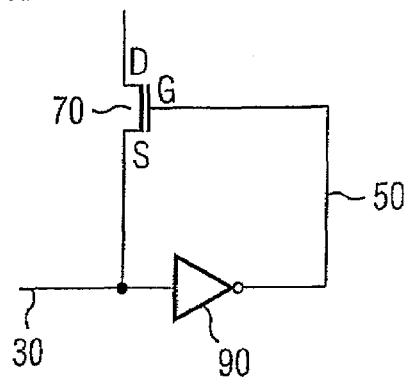
FIG. 2a illustrates a fed-back inverter in inverter source follower configuration.

In the following Detailed Description, reference is made to the accompanying drawings, which form a part hereof, and in which is illustrated by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One embodiment of the present invention provides a voltage regulator for a bit line of a semiconductor memory cell, which provides a bit line voltage that is substantially independent of the operating voltage, the temperature, and the process parameters of the semiconductor devices used.

The voltage regulator includes an inverter, a feedback transistor, and a band gap reference voltage source. The inverter includes an inverter input that is connected to the bit line, and an inverter output. The feedback transistor includes a feedback source that is connected to the inverter input, and a feedback gate that is connected to the inverter output. To this extent, the inventive voltage regulator is equal to the known voltage regulator. The feedback via the feedback transistor again provides for a voltage stabilization. The band gap reference voltage source predetermines the voltage level to which the bit line and the inverter input are to be regulated. The operating point of the voltage regulator thus no longer depends on the characteristic curve progression of the inverter. This is because the input voltage is now impressed by the band gap reference voltage source at the input.

The band gap reference voltage source is a per se known voltage source that supplies a substantially temperature-independent reference voltage. Usually, band gap reference voltage sources are also almost independent of the process parameters during manufacturing, and independent of the operating voltage $V_{DD}$. Different band gap reference voltage sources are known. The temperature independency is achieved in that two temperature-dependent voltages are interlinked such that the temperature dependencies of the two voltages mutually eliminate themselves. Due to the use of a reference voltage-stabilized inverter, there results a distinctly smaller scattering of the bit line voltage than with a standard inverter with respect to process fluctuations and fluctuations of the operating voltage and the temperature. The very good read rate is, however, maintained.

The inverter includes an inverter transistor. The inverter transistor includes an inverter gate, an inverter source, and an inverter drain. The inverter gate is connected to the inverter input. The inverter drain is connected to the inverter output, and the inverter source is grounded (VSS). As long as the inverter transistor blocks, i.e. in the case of low input voltages, the operating voltage across the output of the inverter transistor drops. If the input voltage increases above the threshold voltage $U_{th}$ of the inverter transistor, an increasing drain current will flow. In so doing, the inverter transistor operates in the saturation region. If the input voltage is continued to be increased, the output voltage will tilt in the direction $V_{SS}$. The characteristic curve for the input and the output voltages is similar to that of FIG. 2b.

A voltage-controlled current source is connected between an operating voltage (VDD) and the inverter drain. The current source is configured to supply a predetermined current to the inverter transistor. The band gap reference voltage source controls the voltage-controlled current source with a reference voltage. The impressed drain current causes the gate voltage of the inverter transistor to assume a predetermined value. By the circuit selected, a voltage is applied to the input of the inverter transistor without additional current being fed to the inverter gate. The additional current would distort the measurement of the current on the bit line.

In accordance with a further embodiment, the current source includes a current source transistor. A current mirror is configured to provide an output current as a function of an input current, wherein the output current of the current mirror supplies the predetermined current of the current source. The current source transistor includes a current source gate, a current source, and a current source drain. The current source gate is connected to the band gap reference voltage source. The current source is grounded ($V_{SS}$). The current source drain is configured to provide the input current of the current mirror.

The current source transistor is controlled by the band gap reference voltage source such that it has a constant gate-source-voltage. The gate-source-voltage causes a drain current that is mirrored by the current mirror to the drain of the inverter transistor. The drain currents of the current source transistor and of the inverter transistor are of equal intensity at the operating point. The bit line voltage is thus controlled by the voltage of the band gap reference voltage source.

The inverter transistor and the current source transistor are designed identically. Furthermore, they are accommodated on an integrated circuit directly adjacent to each other. Consequently, it is to be expected that both always have identical temperatures. Since temperature and process parameter fluctuations have a similar effect on the current driver abilities of the identical current source and inverter transistors, the regulated bit line voltage remains stable. The dependency on the operating voltage $V_{DD}$ is minimal in this configuration. The current consumption is practically no longer dependent on the operating voltage, either. Furthermore, the identical design of the current source and inverter transistors has as a consequence that the output voltage of the band gap reference voltage source or the reference voltage itself, respectively, is present at the inverter gate of the inverter transistor.

The inventive voltage regulator includes a high pass filter that is connected to the inverter input. The high pass filter prevents an overshooting of the bit line voltage when the voltage regulator is switched on. Thus, a rapid tuning behavior of the regulator is achieved, which is important for the correct evaluation of the data content of a memory cell.

A sense amplifier for reading out the state of a semiconductor memory cell via a bit line includes a first and a second inventive voltage regulator, and a differential amplifier. The first voltage regulator is connected to a first bit line of a semiconductor memory cell to be measured. The first and second voltage regulators are of identical structure, and the second voltage regulator is connected to a second bit line of a reference semiconductor memory cell. The differential amplifier is configured to detect a difference between the current intensity of the first and second bit lines.

Instead of using the absolute value of the bit line current as a measurement of the memory state, the bit line current of the memory cell to be measured is compared with the bit line current of a reference memory cell, the memory state of which is known. The difference between the memory cells is a more reliable measurement of the memory state.

Possibly, the current of the reference memory cell is also scaled via the mirror ratio of a current mirror.

The sense amplifier includes a differential element and an amplifying element. A differential element output is connected with an amplifying element input. The differential element includes a first current mirror for mirroring the first current from the first bit line to a first line, and a second current mirror for mirroring the second current from the second bit line to a second line, wherein the first and second lines are connected with the amplifying element input via a node.

Figure 3:
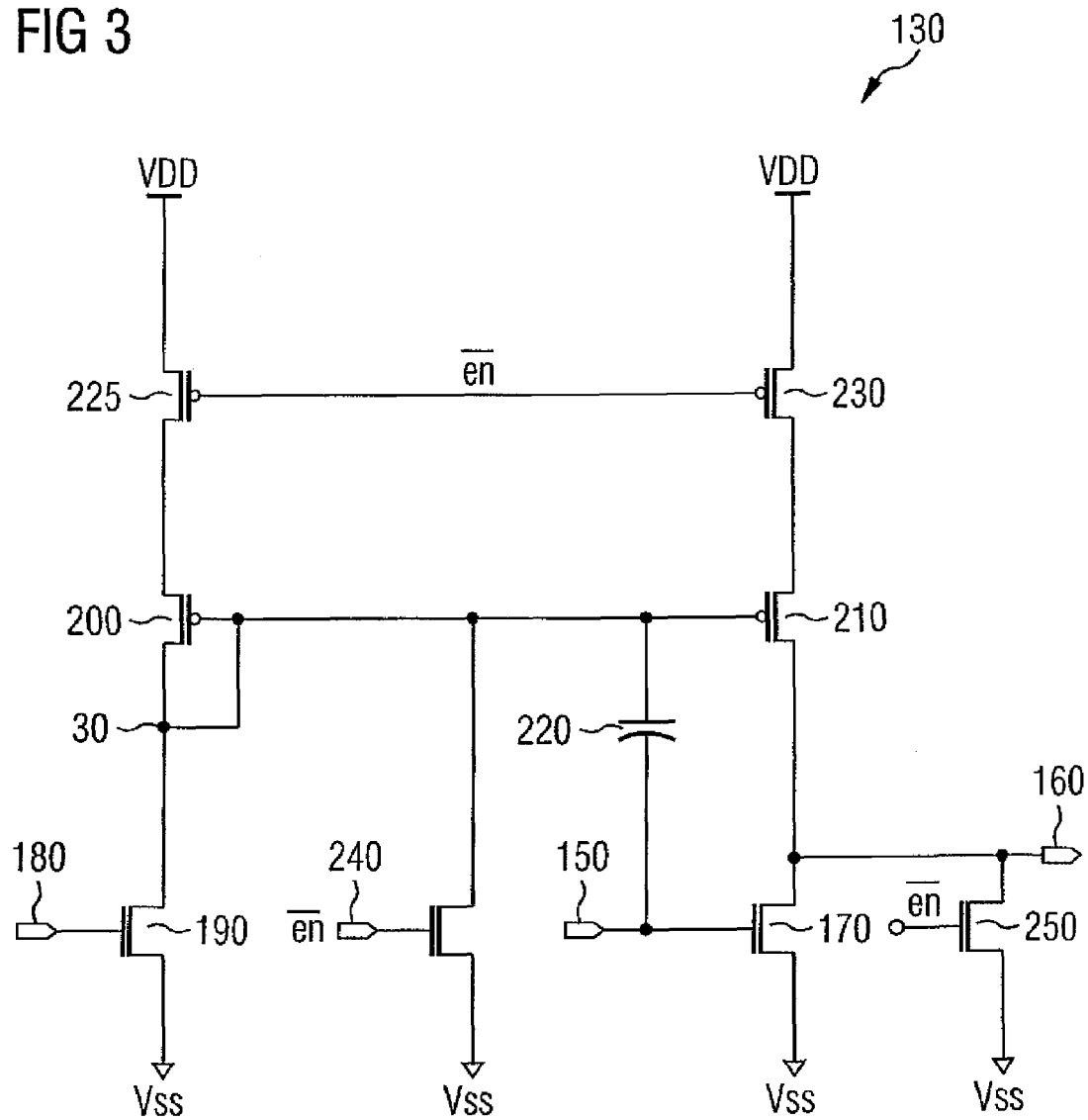
FIG. 3 illustrates an embodiment of a band gap reference voltage-stabilized inverter of an inventive voltage regulator.

The band gap reference voltage-stabilized inverter illustrated in FIG. 3 includes an input 150 and an output 160. The band gap reference voltage-stabilized inverter keeps the voltage at the input 150 on a reference voltage. The band gap reference voltage-stabilized inverter includes an inverter transistor 170. The gate of the inverter transistor constitutes the input 150 of the voltage regulator. The drain of the inverter transistor 170 is connected with the output 160 of the band gap reference voltage-stabilized inverter. The source of the inverter transistor 170 is at ground potential $V_{SS}$.

Figure 2B:
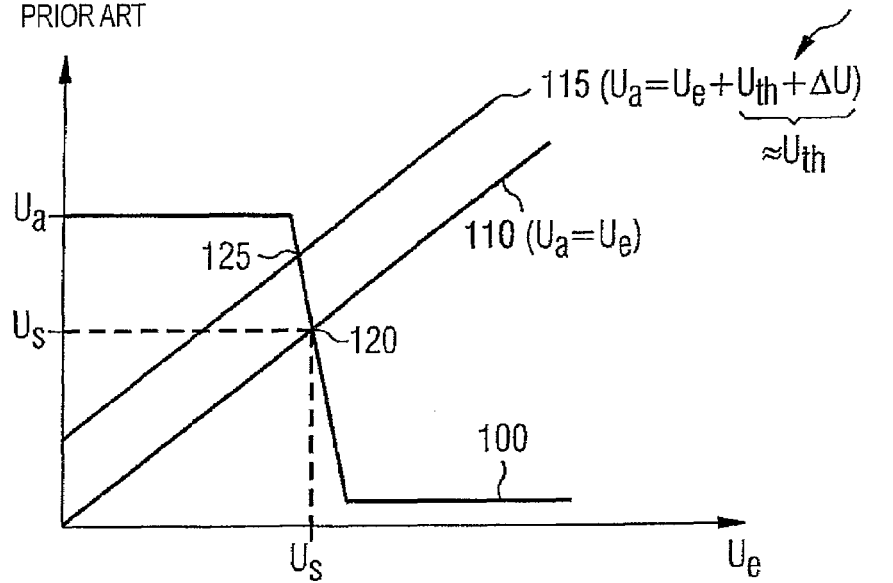

The inverter transistor 170 is operated in source circuit, so that the characteristic transmission curve of the transistor 170 corresponds to the characteristic curve of an inverter illustrated in FIG. 2b. The output of the inverter transistor 170 is, like in FIG. 2a, fed back to the input via a feedback transistor 70 (which is not illustrated in FIG. 3).

Furthermore, a (not illustrated) band gap reference voltage source is provided which feeds a reference voltage $V_{ref}$ to a gate input 180 of a current source transistor 190. The current source transistor 190 acts as a voltage-controlled current source in the band gap reference voltage-stabilized inverter of FIG. 3. The source of the current source transistor 190 is at ground potential $V_{SS}$. The band gap reference voltage source controls the drain current of the current source transistor 190 via the gate 180.

The transistors 200 and 210 jointly form a current mirror of the band gap reference voltage-stabilized inverter of FIG. 3. The drain current of the current source transistor 190 is thus mirrored to the drain of the inverter transistor 170. The sources of both transistors 190 and 170 are at ground potential $V_{SS}$. The source drain current through both transistors 190 and 170 is of equal intensity. Consequently, the voltage at the gate of the inverter transistor has to be as high as the voltage at the gate of the current source transistor 190. Thus, the reference voltage at the input 180 is transmitted to the input 150.

The operating point of the fed-back inverter transistor is set to the reference voltage of the reference voltage source. Thus, the operating point is independent of the characteristic curve of the inverter transistor 170. Both transistors 170 and 190 are of identical structure, so that temperature fluctuations and process parameter fluctuations have equal effects on both transistors and thus have no influence on the operating point.

The transistors 200 and 210 form a current mirror. Both transistors 200 and 210 are of identical design. The gates of both transistors 200 and 210 are connected with each other. Therefore, the gate source voltage is equal with both of them. The input current of the current mirror is the drain current of the transistor 200, the output current of the current mirror is the drain current of the transistor 210.

Furthermore, a capacitor 220 is connected between the gates of the transistors 200 and 210 and the input 150 of the band gap reference voltage-stabilized inverter. The capacitor 220 acts as a high pass filter. The high pass filter provides for the bit line voltage to be attenuated during the switching on of the voltage regulator so as to avoid overshooting.

The remaining transistors 225, 230, 240, and 250 illustrated in FIG. 3 merely serve as switches for switching the voltage regulator on or off. The transistor 240 effects that the gate line of the current mirrors 200 and 210 is at ground potential in the switched-off state. Thus, the input current of the current mirror can no longer be mirrored to the output. In the switched-off state, the transistor 250 effects that the output of the inverter transistor 170 is put to ground potential. The output 160 thus can no longer be fed back to the input 150 to stabilize the voltage at the input 150. The transistors 225 and 230 each disconnect in the switched-off state the supply voltage $V_{DD}$ from the band gap reference voltage-stabilized inverter.

Figure 4:
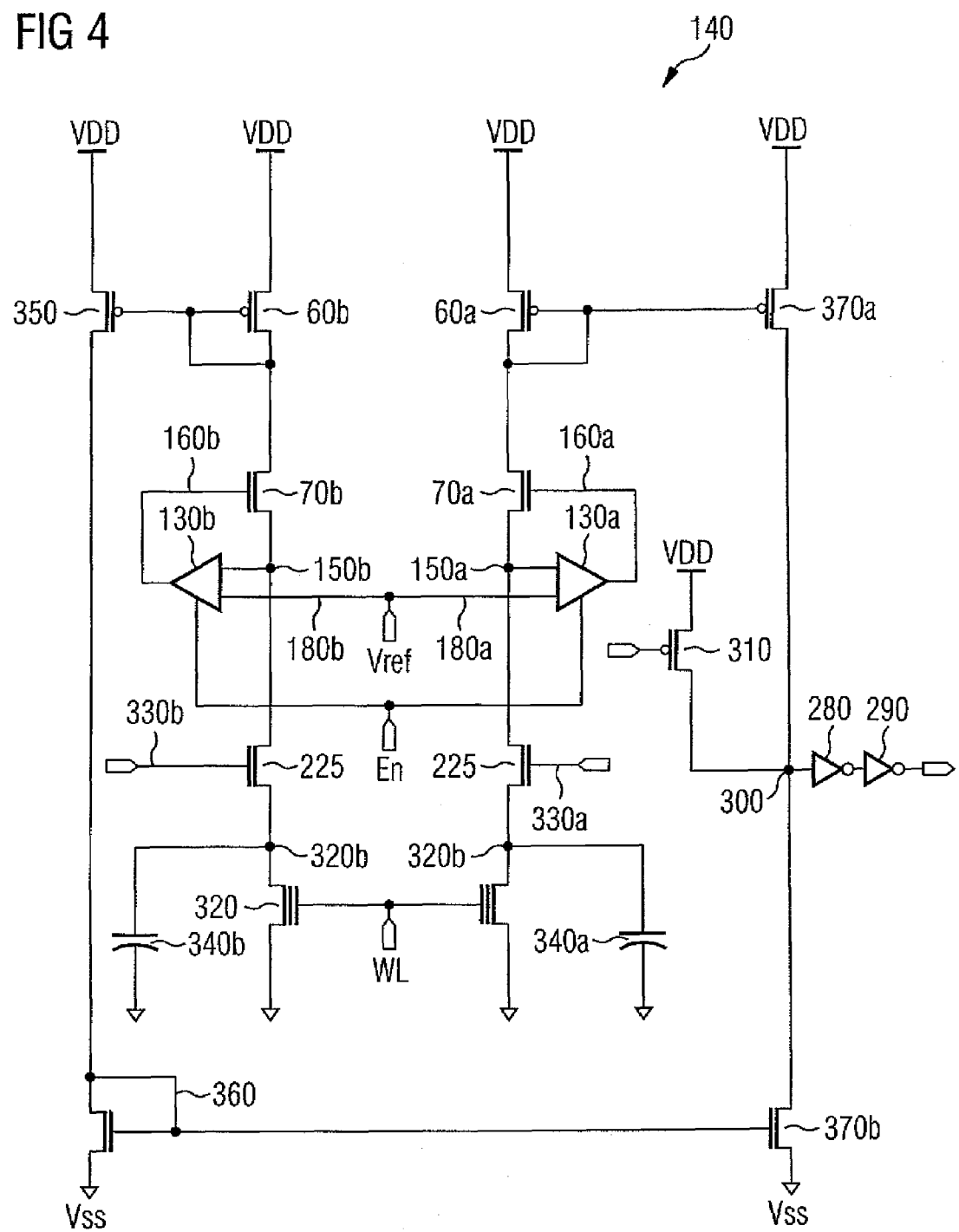
FIG. 4 illustrates an embodiment of an inventive sense amplifier.

FIG. 4 illustrates the embodiment of the inventive sense amplifier. The sense amplifier includes a first band gap reference voltage-stabilized inverter 130a and a second band gap reference voltage-stabilized inverter 130b. Both band gap reference voltage-stabilized inverters 130a and 130b correspond to the band gap reference voltage-stabilized inverter 130 illustrated in FIG. 3.

The band gap reference voltage-stabilized inverters 130a and 130b each comprise an input 150a or 150b, respectively, and an output 160a or 160b, respectively. They are each fed back to the input 150a or 150b, respectively, via a feedback transistor 70a or 70b, respectively. Furthermore, both band gap reference voltage-stabilized inverters 130a and 130b comprise an input 180a or 180b, respectively, for the reverence voltage $V_{ref}$. In addition, an input En for switching on or off the voltage regulators is provided for both band gap reference voltage-stabilized inverters 130a and 130b.

The input 150a of the band gap reference voltage-stabilized inverter 130a is connected with the bit line 320a of the memory cell to be read out. A reference memory cell 320 is connected with the input 150b. A switch transistor 330a is provided for the selection of the column of the memory cell to be read out, while the switch transistor 330b is provided for the selection of the column of the reference memory cell. Both bit lines each comprise a capacity designated by reference numbers 340a and 340b in FIG. 4.

For the simultaneous reading out of both memory cells, the identical voltage regulators apply the respectively equal reference voltage $V_{ref}$ to the respective bit lines 320a and 320b. The resulting bit line current is mirrored by a plurality of current mirrors on lines to the node 300. The transistors 60a and 370a form a current mirror that mirrors the bit line current of the memory cell to be read out to the node 300. The transistors 60b and 350 and the transistors 360 and 370b form two current mirrors connected in series, which mirror the bit line current of the reference memory cell to the node 300. The voltage at the node 300 either tilts to the operating voltage $V_{DD}$ or to the ground potential $V_{SS}$, depending on whether the bit line current of the reference cell is smaller or larger than the bit line current of the memory cell to be read out. The resulting voltage is coupled out at the node via two inverters 280 and 290 that are connected in series. Alternatively to the current comparison at the node 300, the voltages at the transistors 60a and 60b may also be assessed directly with a voltage comparator. Due to the use of two band gap reference voltage-stabilized inverters 130a and 130b, there results a distinctly smaller scattering of the bit line voltage with respect to operating voltage, temperature, and process parameters, than with a standard inverter. The very good read rate is, however, maintained.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A voltage regulator for a bit line of a semiconductor memory, comprising:
    a reference voltage source providing an output voltage at a substantially constant voltage;
    a feedback transistor; and
    a voltage-stabilized inverter comprising:
        a first input connected to the bit line and to a source of the feedback transistor;
        a second input connected to the substantially constant voltage;
        an output connected to a gate of the feedback transistor to regulate a voltage on the bit line;
        an inverter transistor;
        a current source transistor parallel to the inverter transistor; and
        a current mirror between an operating voltage and the inverter transistor.

2. The voltage regulator according to claim 1, wherein the inverter transistor comprises an inverter gate, an inverter source, and inverter drain, wherein the inverter gate is connected to the first input, the inverter drain is connected to the output and the inverter source is at ground.

3. The voltage regulator according to claim 2 wherein the current source transistor and the inverter transistor are identical, so that the output voltage of the reference voltage source adjusts itself at the inverter gate of the inverter transistor.

4. A sense amplifier for reading out the state of a semiconductor memory cell via a bit line, comprising:
    a first voltage regulator according to claim 1, wherein a first input of a voltage-stabilized inverter of the first voltage regulator is connected to a first bit line of a semiconductor memory cell to be measured; and
    a second voltage regulator, wherein the first and second voltage regulators are of identical structure, and wherein a first input of a voltage-stabilized inverter of the second voltage regulator is connected to a second bit line of a reference semiconductor memory cell, and wherein a difference between a current intensity of the first and second bit lines is indicative of the state of the semiconductor memory cell.

5. The sense amplifier according to claim 4, further comprising:
    a differential element; and
    an amplifying element, wherein a differential element output is connected with an amplifying element input;
    wherein the differential element comprises:
    a first current mirror for mirroring the first current from the first bit line to a first line; and
    a second current mirror for mirroring the second current from the second bit line to a second line, wherein the first and second lines are connected with the amplifying element input via a node.

6. A semiconductor memory, comprising:
    a bit line:
    a memory cell coupled to the bit line;
    a voltage regulator for the bit line, comprising:
        a reference voltage source providing an output voltage at a substantially constant voltage;
        a feedback transistor; and
        a voltage-stabilized inverter comprising a first input connected to the bit line and to a source of the feedback transistor, a second input connected to the substantially constant voltage, an output connected to a gate of the feedback transistor to regulate a voltage on the bit line, an inverter transistor, a current source transistor parallel to the inverter transistor, and a current mirror between an operating voltage and the inverter transistor.

7. The memory according to claim 6, wherein the inverter transistor comprises an inverter gate, an inverter source, and inverter drain, wherein the inverter gate is connected to the first input, the inverter drain is connected to the output, and the inverter source is at ground.

8. The memory according to claim 7, wherein the current source transistor and the inverter transistor are identical, so that the output voltage of the reference voltage source adjusts itself at the inverter gate of the inverter transistor.

9. The memory according to claim 6, wherein the voltage regulator is a first voltage regulator and the memory cell is a memory cell to be measured and the bit line is a first bit line, the memory further comprising:
a second voltage regulator, wherein the first and second voltage regulators are of identical structure, and wherein the second voltage regulator is connected to a second bit line of a reference memory cell, wherein a difference between a current intensity of the first and second bit lines is indicative of the state of the memory cell to be measured.

10. The memory according to claim 9, further comprising:
a differential element; and
an amplifying element, wherein a differential element output is connected with an amplifying element input;
wherein the differential element comprises:
a first current mirror for mirroring the first current from the first bit line to a first line; and
a second current mirror for mirroring the second current from the second bit line to a second line, wherein the first and second lines are connected with the amplifying element input via a node.

11. The memory according to claim 6, comprising:
wherein the memory cell is a non-volatile memory cell.

12. The memory according to claim 11, wherein the memory cell is a flash memory cell.

13. The memory according to claim 11, wherein the memory cell is an EEPROM memory cell.

14. A voltage regulator for a bit line of a semiconductor memory, comprising:
a reference voltage source providing a substantially constant voltage;
a feedback transistor; and
a voltage-stabilized inverting means including a first input connected to the bit line and to a source of the feedback transistor, a second input connected to the substantially constant voltage, an output connected to a gate of the feedback transistor which controls the feedback transistor to regulate a voltage on the bit line, an inverter transistor, a current source transistor parallel to the inverter transistor, and a current mirror between an operating voltage and the inverter transistor.

15. An integrated circuit comprising a voltage regulator comprising:
a reference voltage source providing a substantially constant reference voltage;
a feedback transistor;
a voltage-stabilized inverter comprising:
a first input connected to a bit line and to a source of the feedback transistor;
a second input connected to the substantially constant reference voltage;
an output connected to a control input of the feedback transistor to regulate a voltage on the bit line;
an inverter transistor
a current source transistor parallel to the inverter transistor; and
a current mirror between an operating voltage and the inverter transistor; and one or more memory components coupled to the bit line.

16. The integrated circuit according to claim 15, wherein the inverter transistor comprises an inverter gate, an inverter source, and inverter drain, wherein the inverter gate is connected to the first input, the inverter drain is connected to the output, and the inverter source is at ground.

* * * * *